United States Patent [19]

Change, Jr.

[11] Patent Number: 4,816,713
[45] Date of Patent: Mar. 28, 1989

[54] PIEZOELECTRIC SENSOR WITH FET AMPLIFIED OUTPUT

[76] Inventor: Nicholas D. Change, Jr., 7514 Hatillo, Canoga Park, Calif. 91306

[21] Appl. No.: 106,395

[22] Filed: Oct. 9, 1987

[51] Int. Cl.$^4$ .............................................. H01L 41/08
[52] U.S. Cl. ................................. 310/319; 310/329; 310/338
[58] Field of Search ............... 310/316, 317, 319, 338, 310/339, 366, 329

[56] References Cited

U.S. PATENT DOCUMENTS

| | | | |
|---|---|---|---|
| 3,322,980 | 5/1967 | Faure | 310/338 X |
| 3,389,276 | 6/1968 | Gradin et al. | 310/329 X |
| 3,390,286 | 6/1968 | Gradin et al. | 310/329 |
| 3,400,284 | 9/1968 | Elazar | 310/329 X |
| 3,601,712 | 8/1971 | Elazar | 310/319 X |
| 4,460,842 | 7/1984 | Waanders | 310/338 |
| 4,499,566 | 2/1985 | Abbott | 310/366 X |
| 4,637,246 | 1/1987 | Lombard et al. | 310/329 X |

*Primary Examiner*—Mark O. Budd
*Attorney, Agent, or Firm*—Roger A. Marrs

[57] ABSTRACT

A sensor is disclosed herein employing a high-sensitivity, high-resolution piezoelectric device for converting physical forces into an electrical signal. An electrical feedback circuit is utilized to cancel the capacitance of piezoelectric crystals so as to provide voltage gain with little increase in noise level. The circuit includes a unity gain amplifier outputting only pure signal gain resulting in an increase in resolution as well as in signal output.

2 Claims, 1 Drawing Sheet

STATE OF THE ART

PIEZOELECTRIC SENSOR WITH FET AMPLIFIED OUTPUT

BACKGROUND OF THE INVENTION

1. Field of the Invention

The present invention relates to the field of sensors or transducers for converting physical forces into an electrical signal and, more particularly, to a novel piezoelectric device of this type having the ability to cancel the capacitance of piezoelectric crystals used in the device so as to provide a signal gain with improvement in signal to noise ratio.

2. Brief Description of the Prior Art

Transducers of the self-generating, piezoelectric type have been employed in the past for measurement of dynamic force, pressure or acceleration. A specific type of such transducers or sensors employs an integral, unity gain, FET input, impedance converting amplifier such as is disclosed in U.S. Pat. No. 3,569,747. The piezo crystal element is usually made with two or more quartz, or other material, crystals, and when properly connected to the amplifier, generates a charge Q which, by virtue of capacitance C, forms a voltage V at the input of the amplifier. The following electrostatic equation defines the voltage and resultant signal as follows:

$$V = (Q/C) \quad EQ\ 1$$

V = Voltage at gate of FET, Volts
Q = Total charge generated by piezo element due to measurand input, picocoulombs
C = Total shunt capacitance including the piezo element capacitance, the stray capacitance and the input capacitance of the FET, picofarads The amplifier used in conventional circuits utilizes unity gain, non-inverting common drain amp (or source follower), and a voltage V will appear at a source terminal superimposed upon a quiescent DC voltage at the source terminal. The power unit consists of a DC voltage source such as a battery or a power supply and a constant current device to serve as a remote source load. A DC blocking capacitor in the power unit blocks the source voltage bias so as to return the dynamic signal to a zero voltage baseline.

Common drain voltage gain amplifiers have been employed to increase the signal level but problems and difficulties exist with such conventional gain circuits. By reducing the negative voltage feedback to the amplifier, these circuits can boost the output voltage measurably; however, because of the Miller effect which multiplies input capacitance by amplifier gain, the effective gain is reduced, in accordance with the electrostatic equation, EQ 1. This increase in input capacitance actually decreases the voltage across the piezoelectric crystal due to the Miller effect, reducing the effectiveness of voltage gain circuits. Further, these gain circuits amplify the FET broad band noise as well as the signal, resulting in no increase in resolution.

Therefore, a long-standing need has existed to employ a high-sensitivity, high-resolution piezoelectric sensor which utilizes electronic feedback to cancel the capacitance of the piezoelectric crystals thereby providing gain with attendant increase in signal to noise level.

SUMMARY OF THE INVENTION

Accordingly, the above problems and difficulties are obviated by the present invention which provides a novel high-sensitivity, high-resolution piezoelectric sensor incorporating a unity gain amplifier so that there is no increase in amplifier noise with only a pure signal gain resulting in a commensurate increase in resolution as well as in signal output. In one embodiment of the invention, a pair of crystals are stacked together with electrodes and insulators between a mass and a base wherein the stack is held tightly together under compressive force by means of a pre-tightened or pre-loaded screw. One electrode of the pair is electrically connected to an FET amplifier while the drain of the amplifier is electrically connected to the base. A feature of the invention resides in providing one of the electrodes in a dual mode having a portion of the electrode on either side of the first electrode and wherein the dual electrode is connected to a source terminal of the amplifier. Thus, the effect of crystal capacitance is virtually cancelled by reducing a voltage potential across the crystals. Operatively, when a dynamic charge Q is generated by inertial force of the mass, it appears positive at the first electrode with respect to the dual electrode. However, the dual electrode is now more positive with respect to ground by virtue of the fact that it is driven positive by the source terminal. The resultant overall signal output is increased approximately by the ratio of crystal capacitance plus stray capacitance plus FET input capacitance to stray capacitance plus FET input capacitance. The noise level is not appreciably changed and may even improve slightly since the input capcitive load as seen by the FET is reduced.

Therefore, it is among the primary objects of the present invention to provide a novel high-sensitivity, high-resolution piezoelectric sensor that incorporates an electronic feedback circuit adapted to cancel the capacitance of a piezoelectric crystal so as to provide gain with improvement in signal to noise level.

Another object of the present invention is to provide a novel piezoelectric sensor, with integral impedance converting electronics employing a unity gain amplifier wherein negligible increase in amplifier noise is experienced resulting in a commensurate increase in resolution as well as in signal output. Such device is applicable to many types of sensors including force, pressure and acceleration sensors.

Still another object of the present invention is to provide a novel gain circuit for use in connection with voltage gain amplifiers used in piezoelectric crystal transducers or sensors whereby the effect of crystal capacitance is canceled by reducing the voltage potential across the crystals.

BRIEF DESCRIPTION OF THE DRAWINGS

The features of the present invention which are believed to be novel are set forth with particularity in the appended claims. The present invention, both as to its organization and manner of operation, together with further objects and advantages thereof, may best be understood by reference to the following description, taken in connection with the accompanying drawings in which:

DESCRIPTION OF THE PREFERRED EMBODIMENT

Figure 1:
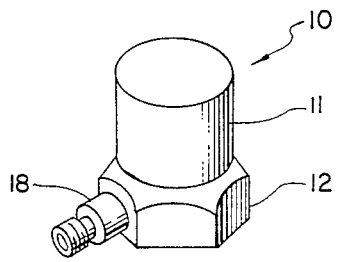
FIG. 1 is a perspective view of an accelerometer utilizing a piezoelectric sensor incorporating the novel capacitance feedback circuit of the present invention.

Referring to FIG. 1, an accelerometer is illustrated in the general direction of arrow 10 which is employed for measuring dynamic force such as vibration, acceleration, impact or the like. Although such a device is illustrated in FIG. 1, it is to be understood that the present invention may be used in connection with other dynamic force measurement devices or pressure sensitive devices. However, for purposes of utility, the present invention may be used in such an accelerometer. In such apparatus, the device 10 includes a body 11 enclosing a force sensor carried on a base 12 and is intended to engage with a structure for the purpose of sensing structural excitation. The device 10 contains the force sensor which is a transducer and, in one form, the transducer may be a piezoelectric force sensor which produces a voltage output signal exactly analogous to the force or vibratory impulse produced as the structure is moved. This signal is available at output terminal 18.

Referring to FIG. 1, a state-of-the art piezoelectric sensor is illustrated such as may be used in the accelerometer shown in FIG. 1. The sensor includes a piezo element such as crystals identified by numeral 20 which separates a pair of electrodes 21 and 22 respectively. The piezo element usually made with two or more quartz or other material crystals, generates a voltage or charge which is introduced via the electrodes to a field effect transistor included within a unity gain voltage amplifier circuit 23. Internal crystal capacitance is indicated by numeral 24 which is experienced across the electrodes while stray capacitance is indicated by capacitor 25 and input capacitance of the FET is indicated by capacitor 26. A biasing resistor 27 is included in the circuit network. It is important to note that the amplifier 23 has unity gain and an in-phase output voltage appears at a source terminal superimposed upon the quiescent DC voltage at the source. A power unit consists of a DC voltage source such as a battery 28 and a constant current device such as diode 29 is employed to serve as a remote source load. A DC blocking capacitor 30 included in the power unit blocks the source voltage bias, returning the dynamic signal to a zero voltage baseline.

The piezo element 20 generates charge Q which, by virtue of capacitance C, forms voltage V at the input of the FET amplifier 23 in accordance with the previously stated electrostatic equation.

The voltage gain amplifier circuit 23 can boost the output voltage measurably by reducing the amount of negative feedback to the amplifier. However, because of the Miller effect which multiplies input interelectrode capacitance by amplifier gain, the effective gain is reduced in accordance with the electrostatic equation, EQ 1. This increase in input capacitance actually decreases the voltage across the crystal due to the Miller effect, reducing the effectiveness of voltage gain circuits. Furthermore, these gain circuits amplify the FET broad band noise as well as the signal resulting in no increase in resolution.

Figure 3:
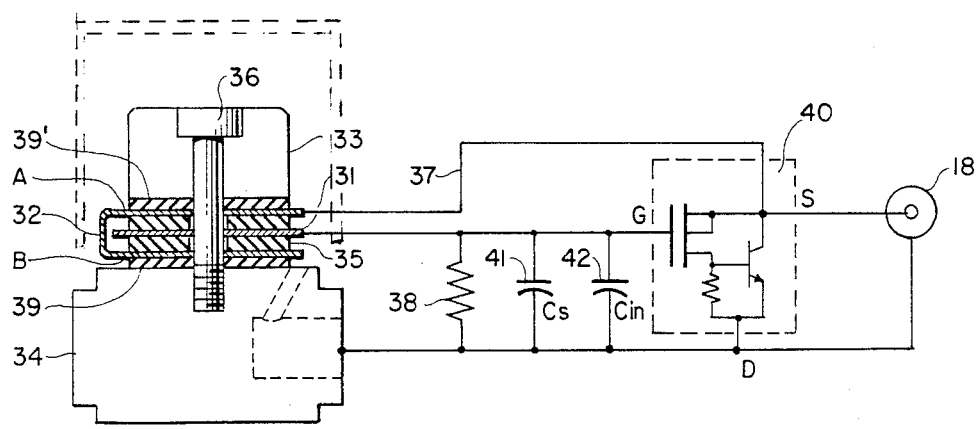
FIG. 3 is a schematic drawing of a circuit incorporating the novel feedback circuit of the present invention and which may be used for a variety of measurement of dynamic force, pressure or acceleration.

The circuit illustrated in FIG. 3, incorporates the inventive concept. A unity gain amplifier is employed so that there is little or no increase in amplifier noise, only pure signal gain, resulting in a commensurate increase in resolution as well as in signal output. It is to be understood that the inventive circuit of the present invention is applicable to many types of sensors including force, pressure and acceleration sensors. The invention as illustrated in FIG. 3, relates to an accelerometer for purposes of illustration and discussion.

Piezoelectric crystals, indicated by numeral 35, are sandwiched between electrodes 31 and 32 respectively. Insulators 39' and 39 are included in the stack with a seismic mass 33. The stack is pre-loaded tightly by means of a screw 36 attached to a base 34 wherein the stack is tightly held together under compressive force. Electrode 31 is electrically connected at the gate of the FET amplifier 40 and the drain of amplifier 40 is connected electrically to the base 34. A biasing resistor 38 is also connected from the base 34 to the gate of the amplifier 40.

Figure 2:
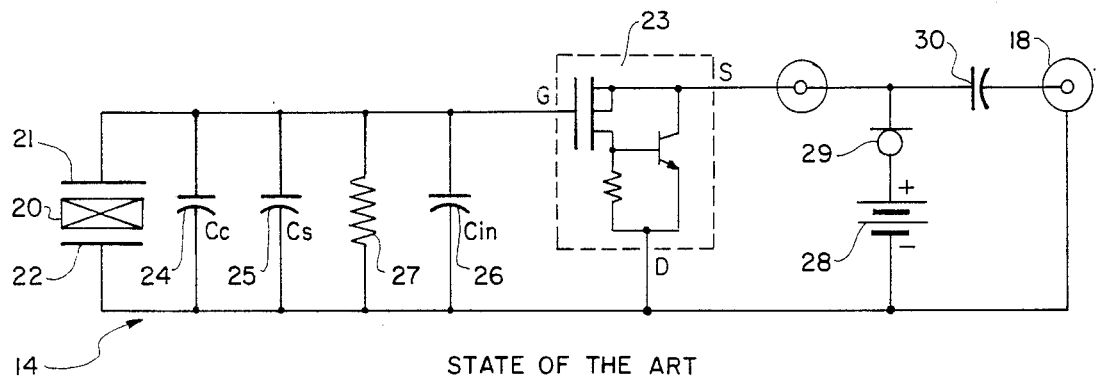
FIG. 2 is a circuit diagram of a conventional state-of-the-art piezoelectric sensor used for measurement of dynamic force, pressure or acceleration.

With respect to electrode 32, it is to be particularly noted that the electrode is a dual electrode connected by wire 37 to the source terminal of amplifier 40. By constructing the electrode 32 into a U-shaped construction having plates arranged in spaced apart relationship that are connected together by a crosspiece along one end, the crystals 35 and the first electrode 31 can be sandwiched between the opposing surfaces of the electrode plates of the electrode 32. One portion or plate of electrode 32 is identified by the letter A while the other plate or portion of the electrode is identified by the letter B. Therefore, the compressive loading by screw 36 with the base 34 causes the opposing surfaces of the electrode portions A and B of electrode 32 to compress against the insulation 35 and the centrally located first electrode 31. Such construction and circuit arrangement is substantially different from the electrode arrangement and circuit arrangement shown in the state-of-the-art circuit of FIG. 2.

In operation of the sensor shown in FIG. 3, when a dynamic charge Q is generated by inertial force on mass 33, it appears positive at electrode 31 with respect to the electrode 32; but, electrode 32 is not at more positive potential with respsect to ground by virtue of the fact that it is driven positive by the source terminal of the amplifier. The action virtually cancels the effect the crystal capacitance by reducing the voltage potential across the crystals. A capacitor can only store charge by virtue of a voltage existing across its dielectric. If there is no voltage difference across its dielectric, there can be no storage of charge. The charge, however, is not dissipated but rather is effectively transferred from the crystals into the much smaller capacitors 41 and 42 which are the stray and interelectrode capacitance of the FET amplifier 40. Because these capacitors are much smaller than the crystal capacitance, a voltage amplification occurs.

Voltage Signal without feedback $V = \dfrac{Q}{Cc + Cs + Cin}$  EQ 2

Voltage Signal with feedback $V = \dfrac{Q}{Cs + Cin}$  EQ 3

Since the amplifier gain is not quite unity (0.98 approximately), the capacitance is not completely nullified.

Overall signal output is increased approximately by the ratio of crystal capacitance plus stray capacitance plus FET input capacitance to stray capacitance plus FET input capacitance.

$$\text{GAIN} = \frac{Cc + Cs + Cin}{Cs + Cin} \qquad \text{EQ 4}$$

An example, if Cc=10 pF, Cs=1 pF and Cin=2 pF, then:

$$\text{GAIN} = \frac{10 + 1 + 2}{1 + 2} = \frac{13}{3} = 4.3 \qquad \text{EQ 5}$$

This is very typical of the results found with quartz crystals. The signal to noise ratio improves since the input capacitive load as seen by the FET is reduced.

The inventive technique will obviously work with crystals other than quartz. However, the higher capacitance of ceramic and other crystals will present a greater load to the FET source, especially at high frequencies.

The results at low frequencies will be more dramatic however.

Typical values for Cc for PZT-5 would be 4,000 pF. Cc and Cin remain the same, hence, using equation 2 and solving for gain:

$$\text{GAIN} = \frac{Cc + Cs + Cin}{Cs + Cin} = \frac{4003}{3} = 1334$$

Therefore, from the foregoing it can be seen that the inventive concept of the present invention provides a high-sensitivity, high-resolution piezoelectric sensor utilizing electronic feedback to cancel the capacitance of the piezoelectric crystals thereby providing gain with little or no increase in noise level.

While particular embodiments of the present invention have been shown and described, it will be obvious to those skilled in the art that changes and modifications may be made without departing from this invention in its broader aspects and, therefore, the aim in the appended claims is to cover all such changes and modificatios as fall within the true spirit and scope of this invention.

What is claimed is:

1. A sensor for the measurement of dynamic force, pressure or acceleration comprising:
   a sensor body having a mass portion and a base portion;
   a first and second layer of piezoelectric crystals disposed between said sensor body mass and base portions and coaxially disposed with respect to each other for generating a voltage signal;
   a first electrode separating said first and second crystal layers;
   a second electrode of U-shaped configuration in cross section retaining said crystal layers and said first electrode between opposing surfaces of said electrode configuration in a sandwiched unity structure;
   electrical insulative material disposed between said second electrode and said sensor body mass and base portions;
   amplifying means operatively coupled between said first and said second electrodes responsive to said voltage signal whereby the effect of crystal capacitance is cancelled by reducing the voltage potential across said crystal layers;
   said amplifying means includes a field effect transistor circuit constituting an integral unity gain, impedance converting amplifier having a source connection and a gate connection;
   said first electrode operably coupled to said transistor circuit gate connection and said second electrode operably coupled to said source connection of said transistor circuit.

2. A sensor for the measurement of dynamic force, pressure or acceleration comprising:
   a sensor body;
   a U-shaped electrode;
   a flat electrode disposed interiorly of said U-shaped electrode in spaced-apart relationship;
   piezoelectric crystals disposed between adjacent and opposing surfaces of said electrodes;
   insulation disposed against opposite exterior surfaces of said U-shaped electrodes and said sensor body;
   said sensor body operatively coupled to said insulation for compressing said electrodes and piezoelectric crystals in a stack under compressive force;
   a field effect amplifier having a gate terminal and a source terminal; and
   electrical means operably coupling said electrodes to said amplifier wherein said flat electrode is electrically connected to the gate terminal of said amplifier and said U-shaped electrodes are electrically coupled to the source terminal of said amplifier whereby said amplifier is responsive to voltage variations as opposed to charge variations.

* * * * *